(12) United States Patent
Kristensen (10) Patent No.: US 9,998,023 B2
(45) Date of Patent: Jun. 12, 2018

(54) MODULAR SUBSEA CONVERTER

(71) Applicant: Siemens Aktiengesellschaft, Munich (DE)

(72) Inventor: Knut Schonhowd Kristensen, Trondheim (NO)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 124 days.

(21) Appl. No.: 15/105,017

(22) PCT Filed: Feb. 3, 2015

(86) PCT No.: PCT/EP2015/052125
§ 371 (c)(1),
(2) Date: Jun. 16, 2016

(87) PCT Pub. No.: WO2015/121104
PCT Pub. Date: Aug. 20, 2015

(65) Prior Publication Data
US 2016/0352240 A1   Dec. 1, 2016

(30) Foreign Application Priority Data
Feb. 14, 2014   (EP) ..................... 14155227

(51) Int. Cl.
| | |
|---|---|
| *H02M 5/458* | (2006.01) |
| *H02K 5/00* | (2006.01) |
| *H05K 5/02* | (2006.01) |
| *H05K 5/03* | (2006.01) |
| *H05K 7/14* | (2006.01) |
| *H02M 7/00* | (2006.01) |
| *H02M 7/49* | (2007.01) |
| *H05K 5/00* | (2006.01) |

(52) U.S. Cl.
CPC .......... *H02M 5/458* (2013.01); *H02M 7/003* (2013.01); *H02M 7/49* (2013.01); *H05K 5/0021* (2013.01); *H05K 5/0204* (2013.01); *H05K 5/0256* (2013.01); *H05K 5/03* (2013.01); *H05K 7/14* (2013.01); *H05K 7/1432* (2013.01)

(58) Field of Classification Search
None
See application file for complete search history.

(56) References Cited

U.S. PATENT DOCUMENTS

| | | | | |
|---|---|---|---|---|
| 2003/0145991 | A1* | 8/2003 | Olsen ................ | E21B 37/00 166/265 |
| 2008/0236810 | A1* | 10/2008 | Bornes ............... | E21B 43/01 166/61 |
| 2013/0286546 | A1* | 10/2013 | Hazel ................. | H02B 7/00 361/602 |

* cited by examiner

*Primary Examiner* — Jared Fureman
*Assistant Examiner* — Aqeel Bukhari
(74) *Attorney, Agent, or Firm* — Harness, Dickey & Pierce, P.L.C.

(57) ABSTRACT

A modular subsea converter for providing a frequency conversion of AC electric power is provided. The modular subsea converter includes at least one base module having a subsea enclosure and electrical connections disposed within the subsea enclosure. It further includes at least one converter module having a converter unit. The converter module is coupled to the base module and has a subsea enclosure in which the converter unit is disposed. The electrical connections of the base module are coupled to the converter unit of the converter module and the subsea enclosure of the converter module is mounted to the subsea enclosure of the base module.

32 Claims, 4 Drawing Sheets

MODULAR SUBSEA CONVERTER

PRIORITY STATEMENT

This application is the national phase under 35 U.S.C. § 371 of PCT International Application No. PCT/EP2015/052125 which has an International filing date of Feb. 3, 2015, which designated the United States of America and which claims priority to European patent application number EP14155227.3 filed Feb. 14, 2014, the entire contents of which are hereby incorporated herein by reference.

FIELD

At least one embodiment of the present invention generally relates to a modular subsea converter for providing a frequency conversion of AC electric power.

BACKGROUND

Due to the increasing energy demand, offshore oil and gas production is moving into deeper waters. For ensuring an efficient and secure production of hydrocarbons from a subsea well, processing facilities are being installed at the ocean floor. Such subsea installations can comprise a range of components, including pumps, compressors and the like as well as a power grid for providing such components with electric power. The power grid may for example comprise a subsea transformer, subsea switchgear and subsea variable speed drives (VSDs). Such components of a subsea installation may be installed at water depths of 3,000 meters or more, so that they are exposed to pressures up to or even in excess of 300 bars. To protect such components from the corrosive seawater and allow operation at these high pressures, they are provided with subsea enclosures.

The construction of such subsea enclosures is technically challenging. Furthermore, they need to go through a qualification procedure in order to ensure that they are suitable for their intended purpose. This is a time- and cost-intensive process. Pressure compensated enclosures are known in which the internal pressure is equalized or balanced to the pressure prevailing in the ambient seawater. A pressure compensator may be used for such purpose. Such enclosures are generally filled with a dielectric liquid, in order to keep volume changes due to the increase in pressure and due to temperature changes relatively low. The dielectric liquid can further support the cooling of electric and electronic components disposed therein.

For operating subsea equipment such as subsea pumps and compressors, it is desirable to make use of a subsea frequency converter which can provide AC electric power at variable frequency. Such device can be used to drive AC motors at variable speed and can thus be termed variable speed drive (VSD). Speed control of AC electric motors comprised in such subsea equipment thus becomes possible. Different types of equipment and different installation sites might require variable speed drives having different power ratings, different control ranges or different requirements regarding the quality of the output AC electric power. When providing subsea variable speed drives for such different requirements, new subsea enclosures are required. Changing the configuration of a variable speed drive is thus a time- and cost-intensive procedure and furthermore requires significant development efforts.

The document US 2013/0286546 A1 discloses a subsea electrical distribution system having a modular subsea circuit breaker. By providing plural circuit breaker modules, a redundancy of the circuit breakers is achieved.

The document EP 2533619 discloses an energy conversion device having a housing with a main section and an end section. The main section can be slid away from the end section along the longitudinal direction without requiring the disconnection of the electrical connections, thus facilitating the maintenance of the conversion device.

SUMMARY

Accordingly, the inventor has recognized that there is a need for improving the versatility of subsea power conversion and of providing an improved subsea frequency converter which mitigates at least some of the drawbacks mentioned above.

According to an embodiment of the invention, a modular subsea converter for providing a frequency conversion of AC electric power is provided. The modular subsea converter comprises at least one base module having a subsea enclosure and electrical connections disposed within the subsea enclosure, and at least one converter module comprising a converter unit, the converter module being mounted to the base module. The converter module has a subsea enclosure in which the converter unit is disposed. The electrical connections of the base module are coupled to the converter unit of the converter module. The subsea enclosure of the converter module is mounted to the subsea enclosure of the base module. The modular subsea converter is configured such that further converter modules and/or base modules are mountable to the modular subsea converter.

According to a further embodiment, a method of manufacturing a modular subsea converter is provided, wherein the modular subsea converter is configured as described in any of the below outlined embodiments. The method includes the step of determining a characteristic, such as power rating or power quality, of the output power to be produced by the modular subsea converter. It further includes the step of adjusting the configuration of the modular subsea converter by adding or removing converter units to or from the converter module, adding or removing converter modules and/or by adding or removing base modules such that the characteristic of the output power is achieved. As an example, more converter units may be added for each output phase to increase the voltage quality or voltage rating. More base modules and/or converter modules may be added to increase the power rating. If a transformer is provided within the modular subsea converter, the number of transformer secondary windings or of transformers may be adjusted accordingly.

BRIEF DESCRIPTION OF THE DRAWINGS

The foregoing and other features and advantages of the invention will become further apparent from the following detailed description read in conjunction with the accompanying drawings. In the drawings, like reference numerals refer to like elements.

DETAILED DESCRIPTION OF EXAMPLE EMBODIMENTS

According to an embodiment of the invention, a modular subsea converter for providing a frequency conversion of AC electric power is provided. The modular subsea converter comprises at least one base module having a subsea enclosure and electrical connections disposed within the subsea enclosure, and at least one converter module comprising a converter unit, the converter module being mounted to the base module. The converter module has a subsea enclosure in which the converter unit is disposed. The electrical connections of the base module are coupled to the converter unit of the converter module. The subsea enclosure of the converter module is mounted to the subsea enclosure of the base module. The modular subsea converter is configured such that further converter modules and/or base modules are mountable to the modular subsea converter.

In an embodiment of such a configuration, the modular subsea converter can be adapted for the particular application, for example by adding further converter modules, adding further base modules to which one or more converter modules may be mounted, or by adding further converter units within the converter module. By being capable of mounting further converter modules and/or base modules, a predetermined characteristic, such as power rating or power quality, of the output power to be produced by the modular subsea converter may be achieved.

Furthermore, by being capable of adding further converter modules and/or base modules having a respective subsea enclosure, it may not be required to engineer a new subsea enclosure for different configurations of the modular subsea converter. Rather, a base module or a converter module having an already qualified subsea enclosure can be added or removed. Accordingly, development efforts can be reduced, and the time and cost required for providing a new configuration of the modular subsea converter can be reduced.

In particular, the modular subsea converter may have an adjustable number of converter modules and/or an adjustable number of converter units (which may be arranged in the same or in different converter modules).

In an embodiment, the converter module may be configured as a scalable converter module, which may include a single power cell or an adjustable number of power cells. The modular subsea converter may be configured for driving a subsea load, in particular subsea equipment, such as subsea pump, a subsea compressor or the like. The modular subsea converter may have a power input, in particular a three-phase power input, and a power output, in particular a three-phase power output. It may be configured to convert AC electric power received at the power input to AC electric power having a controllable AC frequency which is provided at the power output. Since the AC electric power produced with variable frequency may be used to drive such equipment, the modular subsea converter may be termed modular subsea variable speed drive (VSD).

In an embodiment, the modular subsea converter is at least a three-phase converter for converting three-phase AC electric power. The at least one base module may comprise electrical connections for the at least three phases, in particular three output phases, and the at least one converter module may comprise at least one converter module for each of the at least three phases, in particular output phases (e.g. at least three converter modules may be provided in the modular subsea converter, one for each output phase).

Each converter module may have a three-phase power input and a single-phase power output. Accordingly, via at least three converter modules, a three-phase output electric power can be generated.

In a particular embodiment, the subsea converter may be at least a three-phase converter and the at least one base module may comprise at least three base modules. A converter module may be coupled to each of the base modules, and each base module may comprise the electrical connections for a phase of the output AC electric power. In another embodiment, a single base module may be provided which includes the electrical connections for the at least three phases of the output AC electric power.

The three base modules may for example be arranged in a vertical direction one above the other.

In an embodiment, the electrical connections of the at least one base module may comprise for each converter module at least a three-phase power input connection and a single phase power output connection. In another embodiment, the electrical connections may comprise for each converter module at least two three-phase power input connections, or may comprise for each converter unit of the converter module a three-phase power input connection. In another embodiment, no output connection may be comprised within the base module, such output connection may for example be directly provided at the converter module. In an embodiment, the converter module may include at least two converter units, and the electrical connections of the base module may comprise at least two phase shifted three-phase power input connections for the converter module.

In an embodiment, the at least one converter module may be a scalable converter module comprising a selectable number of converter units. Accordingly, in order to increase the number of converter units when going from one design of the subsea converter to another design, the converter module may simply be substituted by another converter module in which the required number of converter units is disposed.

The subsea enclosure of the base module may for example comprise a mounting flange to which the subsea enclosure of the scalable converter module is mounted. The scalable converter module may be provided with different subsea enclosures mountable to the base module's mounting flange. Thus, differently sized subsea enclosures may be qualified for the converter module, so that the number of converter units in the converter module can be relatively easy adjusted by making use of the subsea enclosure having the required size.

As an example, the subsea enclosure of the converter module may have a tubular structure closed at one end and provided with a mounting flange at the other end to mount the subsea enclosure to the base module. The extension of the tubular structure in a longitudinal direction thereof may be determined by the number of converter units disposed in the converter module. The extension of the tubular structure in the longitudinal direction may for example be selectable or adjustable by changing the size of the tubular part of the subsea enclosure in the longitudinal direction. When configuring the modular subsea converter with more converter units, the tubular part of the subsea enclosure may for example be made longer.

The subsea enclosure of the converter module may for example be a cylinder or pipe section, which is closed at one end and which is provided with the mounting flange at the other end. The length of such cylinder or pipe section may then easily be adjusted in accordance with the number of converter units. A new development of the subsea enclosure may in such case not be required, so that it requires only little effort to change the number of converter units in the converter module.

In an embodiment, the configuration of the subsea enclosure is, apart from the longitudinal extension, the same for different numbers of converter units disposed therein. Accordingly, in such configuration, the subsea enclosure may need to be qualified only once, after which it may be used in different configurations by simply adjusting the longitudinal extension of the tubular part of the subsea enclosure. Connections, in particular the electrical connections, may only be provided through the end of the subsea enclosure at which the mounting flange is located, into the base module. In particular, the subsea enclosure of the converter module may have no penetration(s) through its outer wall (i.e. the wall separating the interior of the converter module from surrounding seawater when installed subsea). Accordingly, a safe and reliable subsea enclosure of the converter module may be obtained, which may only need to be sealed at the mounting flange against the subsea enclosure of the base module.

In other embodiments, converter modules may be provided having mounting flanges at both ends of a tubular intermediate section, so that further converter modules may be mounted to such converter module.

In an embodiment, the modular subsea converter comprises at least one converter unit for each output phase of the converted AC electric, preferably at least two, more preferably at least three converter units for each output phase. The converter units may be connected in series to produce the respective output phase of the output AC electric power. In such configuration, in particular by increasing the number of series connected converter units, the quality and/or voltage level of the output AC electric power may be increased. As an example, three or six converter units may be provided for each output phase, e.g. for achieving 18 or 36 pulse rectification. Each converter may be provided in a separate converter module, or one converter module may comprise plural converter units, e.g. the converter units belonging to the same output phase of the output AC electric power.

In an embodiment, the modular subsea converter is configured to use, for each phase of output AC electric power, at least two, preferably at least three or at least six phase-shifted AC electric power sources. The modular subsea converter may comprise for each phase-shifted AC electric power source at least one converter unit per output phase. Each AC electric power source may be a three-phase AC electric power source. As an example, if six phase-shifted power sources are used, and the subsea converter has a three-phase power output, the subsea converter may comprise 6×3=18 converter units. With such six phase-shifted three-phase power sources, 36 pulse rectification may be achieved by the subsea converter.

In an embodiment, the modular subsea converter further comprises at least one transformer providing the at least two, preferably at least three or at least six phase-shifted AC electric power sources. As an example, one transformer having six secondary windings may be provided for generating the at least six phase-shifted AC electric power sources. As mentioned above, each power source may be a three-phase power source, so that each secondary winding may be provided for the three phases. In other configurations, plural transformers may be provided, for example three transformers each having two secondary windings for generating six phase-shifted AC electric power sources, two transformers each having one, two, three or more secondary windings and the like.

The modular subsea converter may comprise at least one transformer module comprising an AC transformer coupled to the electrical connections of the at least one base module. The transformer module may for example have a subsea enclosure to which the subsea enclosure of the base module is mounted. In other embodiments, at least one transformer may be included in the at least one base module.

In a particular embodiment, a transformer module comprising a subsea enclosure may be provided, wherein three base modules are mounted to the subsea enclosure of the transformer module, each base module being provided for a different phase of output AC electric power.

The subsea enclosure of the base module may comprise at least two converter mounting portions, in particular flanges, and to each mounting portion, a converter module may be mounted. The subsea enclosure of the base module may comprise at least one, preferably at least two base-mounting portions, in particular flanges, which are configured for mounting at least a further base module or a transformer module thereto. As an example, one base mounting portion may be mounted to a transformer module, and to the other base mounting portion, a further base module may be mounted.

The at least one base module may comprise a base module having a cylindrically shaped subsea enclosure with base-mounting portions at one or at opposing ends thereof. It may further comprise two converter mounting portions, in particular flanges, for mounting at least two converter modules thereto. The subsea enclosure of the base module may thus have the shape of a crossed fitting with flanges at the four openings. One base module may be provided per output phase of the converted AC electric power.

In another embodiment, the subsea enclosure of the base module may have at least four or at least six converter mounting portions configured to mount respective converter modules thereto.

In an embodiment, the modular subsea converter comprises at least three base modules and at least three, preferably at least six converter modules. These may include a total of at least nine, more preferably at least 18 converter units.

Each converter module may include between one and three converter units. As an example, six converter modules each including three converter units may be provided, wherein always two converter modules are mounted to a base module.

The subsea enclosure of the converter module may be configured to provide, by itself, a liquid-tight seal against an ambient medium, such as seawater. It may thus protect the converter unit disposed therein from seawater even when not mounted to the base module. The converter module may be configured to be retrievable. In particular, it may be configured to be removable from the base module, even when installed subsea. Servicing of the converter module may thus be facilitated.

The connection between the subsea enclosure of the base module and the subsea enclosure of the converter module may be open (e.g. to allow liquid to flow between the converter modules and the base module) or closed. Electrical connections are led into and out of the converter module for electrically contacting the converter unit, e.g. through the above mentioned opening.

The at least one base module may comprise a base module having one or more electrical penetrators or one or more electrical connectors or one or more cable terminations (including oil filled hoses) mounted thereto which provide an electrical output for converted AC electric power of the modular subsea converter. In other embodiments, the output connections can be provided on one base module, on plural base modules, on a transformer module, or on one or plural converter modules. A flange may for example be provided at the subsea enclosure of the base module towards which a wet-mateable connector, a jumper cable, a penetrator or the like can be mounted.

The electrical connections provided within the base module may comprise electrical cables and/or bus bars. Furthermore, within the base module, a control unit and/or a monitoring unit may be provided. The control unit can be configured for controlling the operation of the converter units, in particular for adjusting the frequency of the generated output AC electric power, and the monitoring unit may be configured for example for monitoring the humidity within the base module or modules connected thereto, or water contents of a liquid, such as oil, filling the base module or modules connected thereto.

The modular subsea converter may be configured to be operable within a voltage range of about 1,000 V to about 50,000 V, in particular within a voltage range of about 2,500 V to about 40,000 V. As an example, the voltage of the input electric power provided to e.g. a transformer module may lie within a range of 5,000 V to about 40,000 V, and the voltage of the AC electric power at the output of the subsea converter may lie within a range of about 1,000 V to about 15,000 V. The input frequency may lie within a range of about 40 to 70 Hz, e.g. at 50 or 60 Hz, and the output frequency may lie within a range of about zero to about 300 Hz or 200 Hz.

The converter unit may be a power cell, in particular it may be an H-bridge converter. The converter unit may include insulated gate bipolar transistors (IGBTs) and control electronics for generating output power at variable AC frequency.

In an embodiment, the modular subsea converter comprises at least two converter units for providing the conversion of AC electric power, and further comprises at least two converter modules each comprising at least one converter unit, each converter module being coupled to the base module and having a subsea enclosure in which the respective converter unit is disposed. Accordingly, components of the modular subsea converter can be distributed among several converter modules.

The modular subsea converter may comprise at least two, preferably three output phases. The modular subsea converter may be configured to use at least two phase shifted AC electric power sources. The modular subsea converter may comprise for each phase shifted AC electric power source at least one converter unit per output phase. The converter units are distributed between at least two different converter modules coupled to the base module. As an example, the converter units supplied by one phase shifted power source may be provided in one subsea module or a group of subsea modules, or the converter units providing the AC power output for one output phase may be provided in one subsea module or a group of subsea modules. Combinations are certainly conceivable.

In an embodiment, the converter unit is a power electronic converter unit, and the subsea enclosure of the at least one converter module is a pressure compensated enclosure that is pressure compensated against an ambient pressure. In particular, a pressure compensator may be provided that balances the pressure inside the enclosure of the converter module to the pressure prevailing in the subsea environment when the modular subsea converter is installed subsea (directly or indirectly, e.g. via the medium inside the base module). The enclosure of the base module and the enclosure of the converter modules may both be pressure compensated, thus avoiding large pressure differences between the modules and between each module and the ambient environment. The power electronic components can be adapted to be operable under the ambient pressure prevailing in a subsea environment, e.g. at a water depth of at least 1,000 m, 2,000 m or even 3,000 m.

According to a further embodiment, a method of manufacturing a modular subsea converter is provided, wherein the modular subsea converter is configured as described in any of the above outlined embodiments. The method includes the step of determining a characteristic, such as power rating or power quality, of the output power to be produced by the modular subsea converter. It further includes the step of adjusting the configuration of the modular subsea converter by adding or removing converter units to or from the converter module, adding or removing converter modules and/or by adding or removing base modules such that the characteristic of the output power is achieved. As an example, more converter units may be added for each output phase to increase the voltage quality or voltage rating. More base modules and/or converter modules may be added to increase the power rating. If a transformer is provided within the modular subsea converter, the number of transformer secondary windings or of transformers may be adjusted accordingly.

It is to be understood that the features mentioned above and those yet to be explained below can be used not only in the respective combinations indicated, but also in other combinations or in isolation, without leaving the scope of the present invention.

In the following, embodiments of the invention will be described in detail with reference to the accompanying drawings. It is to be understood that the following description of the embodiments is given only for the purpose of illustration and is not to be taken in a limiting sense.

It should be noted that the drawings are to be regarded as being schematic representations only, and elements in the drawings are not necessarily to scale with each other. Rather, the representation of the various elements is chosen such that their function and general purpose become apparent to a person skilled in the art. It is also to be understood that the coupling of physical or functional units as shown in the drawings and described hereinafter, does not necessarily need to be a direct connection or coupling, but may also be an indirect connection or coupling, for example a connection or a coupling with one or more additional intervening elements, such as fuses, circuit breakers, and the like.

Figure 1:
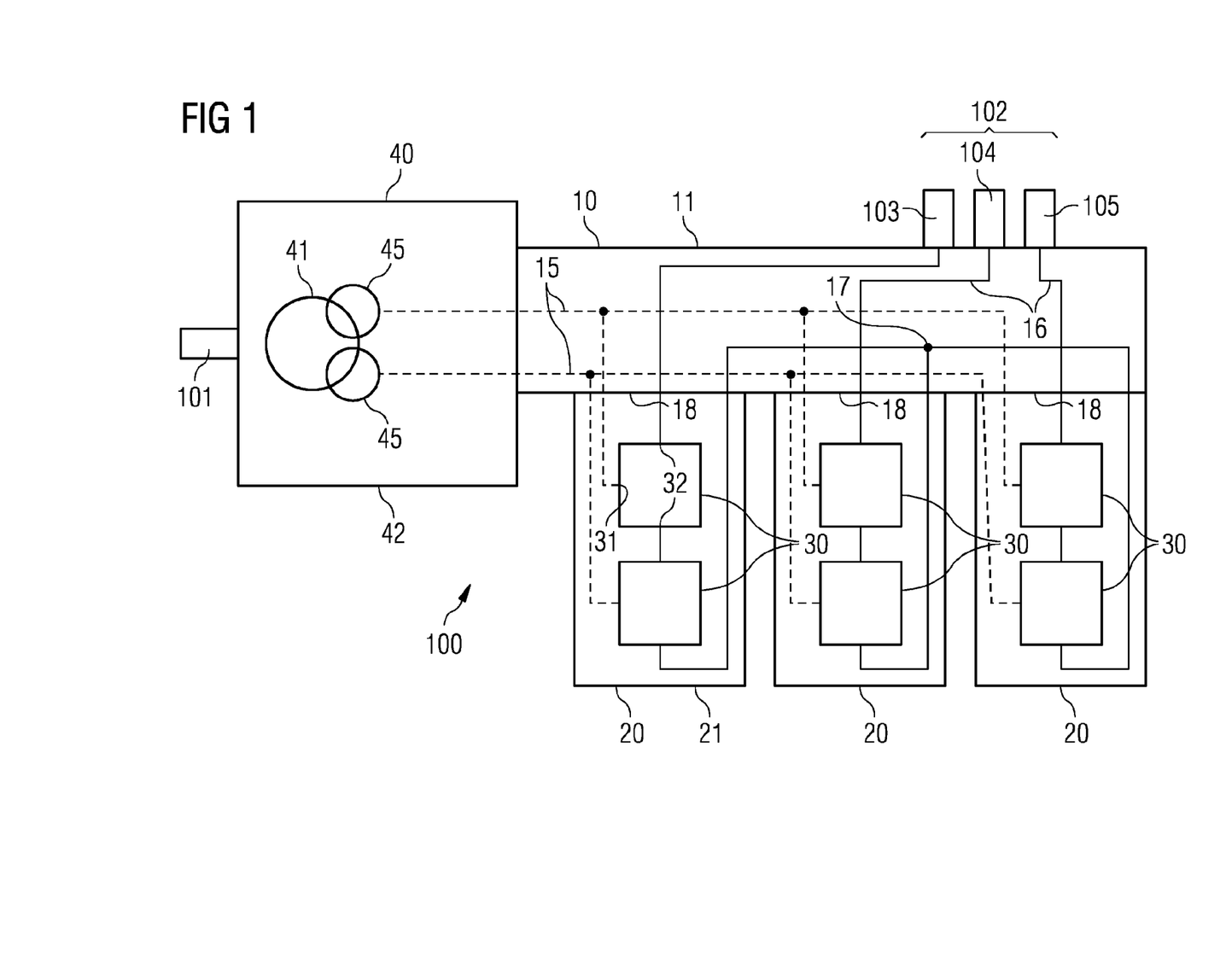
FIG. 1 is a schematic block diagram illustrating a modular subsea converter according to an embodiment of the invention.

FIG. 1 shows schematically a modular subsea converter 100 according to an embodiment of the invention. In the example shown in FIG. 1, the subsea converter 100 includes the base module 10, three converter modules 20 coupled to the base module 10, and a transformer module 40, to which the base module 10 is coupled. The transformer module 40 comprises the input transformer 41. Furthermore, a power input 101 is provided at the transformer module 40 for receiving three-phase AC electric power as an input to the subsea converter 100. The input transformer 41 includes a primary winding and two secondary windings 45, which are configured to produce an AC output that is phase-shifted with respect to each other. Since the example of FIG. 1 shows a three-phase system, the secondary windings 45 are each provided for the three-phases and thus produce a three-phase output (i.e. each secondary winding 45 may in fact comprise three secondary windings).

In other embodiments, the input transformer 41 may be configured differently. It may for example comprise more or fewer secondary windings 45, for example one, three, or six secondary windings, with the power outputs of the respective secondary windings being phase-shifted with respect to each other. In even other configurations, two or more input transformers may be provided, and the secondary windings may be distributed between these two or more input transformers. An example configuration may include three input transformers each having two secondary windings 45, thus producing six phase-shifted AC power outputs. In further configurations of the modular subsea converter 100, no transformer module 40 may be provided, or the input transformer 41 may be provided within the base module 10.

The base module 10 comprises the electrical connections 15, by which three-phase AC electric power is supplied from the power source in form of the transformer 41 to the converter units 30 arranged within the converter modules 20. Base module 10 furthermore includes the electrical connections 16 which supply converted AC electric power from the converter units 30 to the power output 102. The power output 102 is a three-phase power output, the three phases 103, 104 and 105 being shown separately. Note that the dashed electrical connections 15 each include three phases.

In the embodiment of FIG. 1, each converter module 20 comprises two converter units 30. Each converter unit 30 has an input connection 31 at which it receives three-phase AC electric power from the input transformer 41 via the electrical connections 15. Each converter unit 30 further includes a power output 32 at which the respective converter module provides converted single-phase AC electric power. By way of the two terminals of the single phase power output 32, the converter units 30 within the same converter module 20 are connected in series. One terminal of this series connection is connected together with the respective terminals of the other converter modules 20 in the star point 17. The other terminal of this series connection provides the converted single phase AC power output of the respective converter module 20, which is connected via the electrical connections 16 to the power output 102. By controlling the converter units 30 appropriately, the modular subsea converter 100 is thus capable of converting a three-phase AC power received at power input 101 into a three-phase AC power given out at power output 102 of variable AC frequency. This power may be used to drive subsea equipment, such as pumps or compressors. The modular subsea converter 100 may thus be termed modular subsea variable speed drive (modular subsea VSD).

The modular subsea converter 100 may be configured in different ways. Fewer or more converter units 30, which may be power cells, can be provided. As an example, for some applications, modular subsea converter 100 may only comprise one secondary winding 45 and only one converter unit 30 per phase of the power output 102 (i.e. a total of three converter units 30). In other embodiments, three, four, five, six or even more converter units 30 may be provided per phase of the power output 102. The input transformer 41 may comprise a secondary winding 45 for each such converter unit (for all three phases). For example, if six converter units 30 are provided per output phase, the input transformer 41 may comprise six secondary windings 45. For three output phases, a total of 3×6=18 converter units 30 may be obtained. Note that more than three converter modules 20 may be provided. As an example, for each output phase 102, two or more converter modules 20 can be provided, each comprising for example between one and three converter units 30.

The converter units 30 for one output phase 103, 104, 105 of power output 102 are connected in series, so as to achieve a high quality AC power output and/or to increase the output voltage. In other embodiments, further converter units 30 may be connected in parallel for the same output phase of power output 102, so as to increase the power rating of the power output 102, i.e. to drive equipment and loads that require a high input power. Again, such additional converter units 30 may be comprised within the same converter module 20 or additional converter modules 20 can be provided.

As can be seen from the above description, the modular subsea converter 100 has a very variable configuration in which different power qualities, voltage levels and power levels of output AC electric power can be achieved. The subsea converter 100 thus has a modular configuration which allows the adding and removing of converter units 30 for different applications without the need to redesign the enclosure of the subsea converter 100 and go through a new qualification, whereby significant savings in development effort, qualification costs and required time can be achieved.

To achieve the modular variability, the base module 10 is provided which comprises the electrical connections 15, 16 and as mentioned above may comprise further equipment such as control and monitoring equipment. Base module 10 has mounting portions 18 to which the converter modules 20 can be mounted. In the example of FIG. 1, three mounting portions 18 are provided on base module 10, and three converter modules 20 are mounted thereto. In other configurations, base module 10 may for example comprise two, four, six or more mounting portions 18 for converter modules. The configuration of the subsea converter 100 can thus easily be changed by adding or removing converter modules 20 from the base module 10.

Furthermore, the converter modules 20 can be provided with a different number of converter units 30. Converter modules 20 are provided at different sizes with different numbers of converter units 30, and accordingly, for increasing for example the number of converter units 30 per output phase of power output 102, a converter module 20 with a smaller number of converter units 30 can be substituted by a converter module 20 with a larger number of converter modules 30. The modular subsea converter 100 can thus be configured in a fast and efficient way for different applications and power requirements.

Figure 2A:
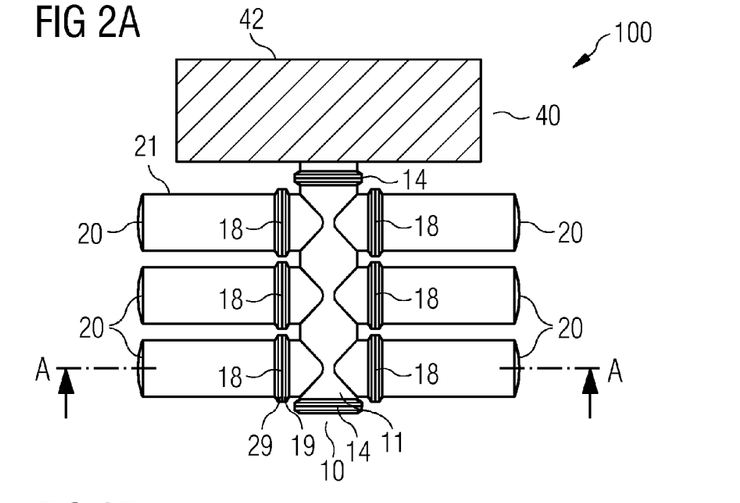
FIGS. 2A to 2C are schematic drawings showing a modular subsea converter according to an embodiment of the invention.
Figure 2B:
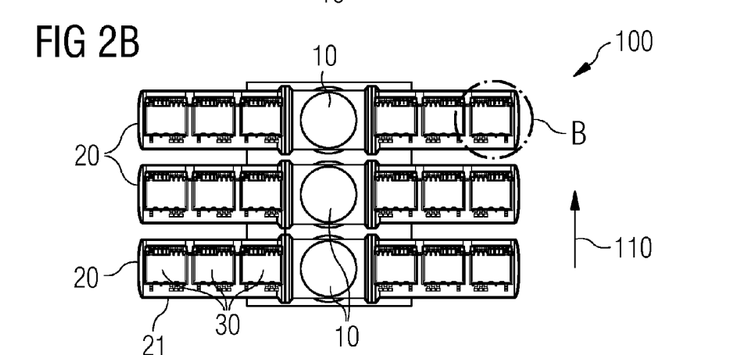
Figure 2C:
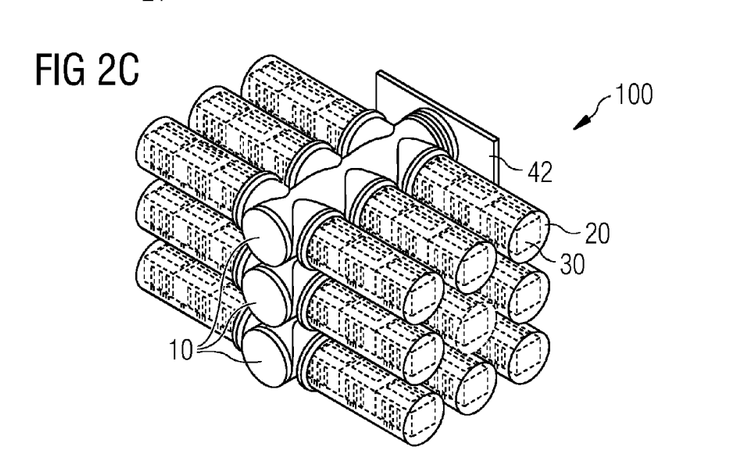
Figure 3A:
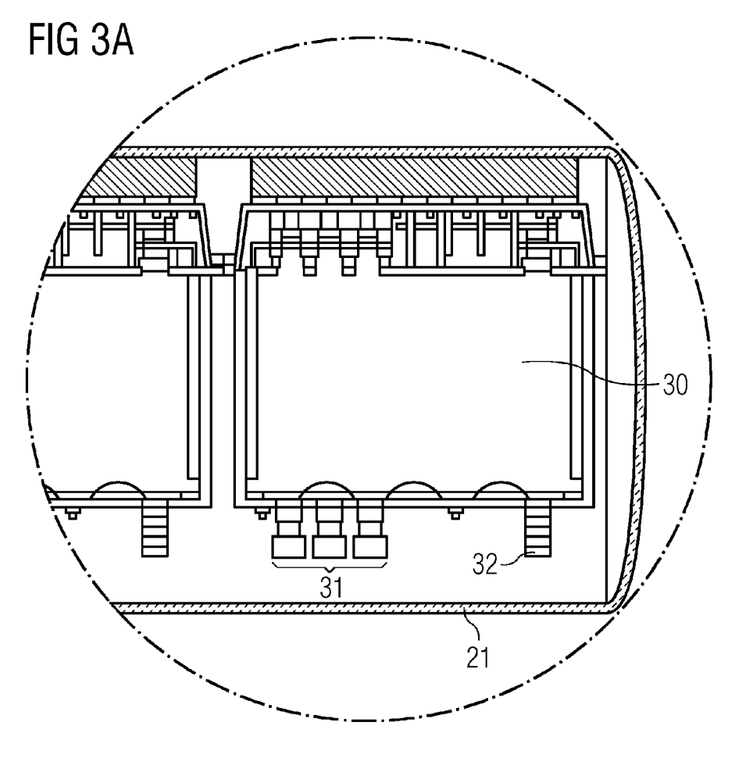
FIGS. 3A and 3B are schematic diagrams showing details of a converter unit that may be used with embodiments of the invention.
Figure 3B:
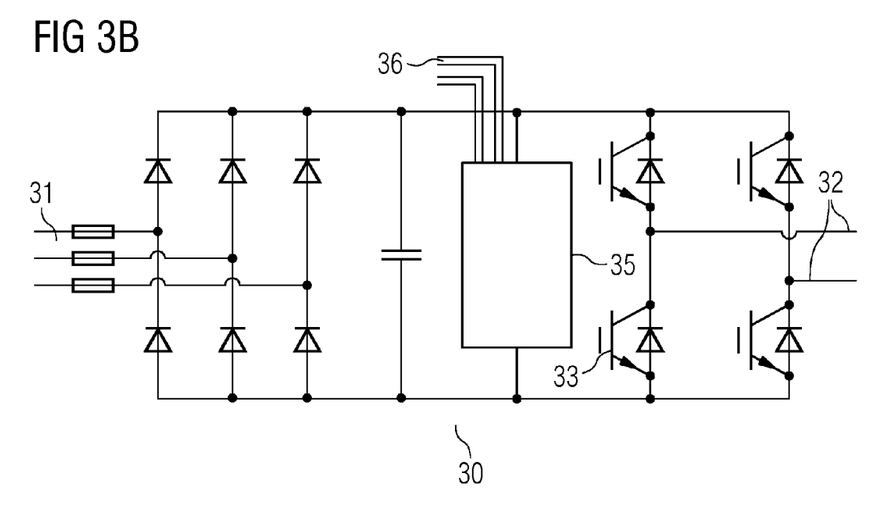

FIGS. 2 to 4 show particular embodiments of the general concept of the modular subsea converter 100 of FIG. 1. Accordingly, the explanations given above are equally applicable to the embodiments illustrated in FIGS. 2 to 4.

FIG. 2 shows a top view of the modular subsea converter 100 according to an embodiment of the invention. In the top view of FIG. 2A, a first base module 10 to which six converter modules 20 are mounted is visible. Base module 10 is mounted to a transformer module 40. The base module 10 has a subsea enclosure 11 comprising six mounting portions 18 for converter modules 20. It further includes two mounting portions 14. At one mounding portion 14, the base module 10 is mounted to a subsea enclosure 42 of the transformer module 40, while the other mounting portion 14 is close by a blind cover. In some embodiments, the blind cover may include one or more of the power outputs 102. In other embodiments, the power outputs 102 may be provided at different positions on the subsea enclosure 11 of base module 10 or they may be provided at the subsea enclosure 42 of transformer module 40.

Converter modules 20 each comprise a subsea enclosure which has a tubular structure. At one end, the subsea enclosure 21 is closed, and at the other end, it comprises a flange 29, which is mounted to a flange 19 of the subsea enclosure 11 of base module 10. In particular, subsea enclosure 21 has the shape of a cylinder, one end of which is closed, for example by a welded plate, while the other end comprises the flange 29. Accordingly, by adjusting the longitudinal extension, i.e. the length of the tubular structure in particular the cylinder, the size of the subsea enclosure 21 can be adjusted in a relatively simple way, without changing the further configuration of the subsea enclosure 21. Different sized subsea enclosures 21 can thus be provided without the need for a new qualification thereof.

In some embodiments, the subsea enclosure 21 may be open at the end at which the flange 29 is provided, so that for example a dielectric liquid filling the base module 10 and the converter module 20 can circulate between base module and converter module 20. In other configurations, the subsea enclosure 21 may be closed at this end to prevent circulation of such dielectric liquid. In even other embodiments, the end of subsea enclosure 21 at which flange 29 is provided may be closed by a wall, so that a liquid-tight sealing of subsea enclosure 21 is achieved even if it is not mounted to the base module 10. In such configuration, the converter module 20 may be retrievable, even when the subsea converter 100 is installed subsea.

FIG. 2B is a sectional front view of the modular subsea converter 100 taken along the line A-A shown in FIG. 2A. As can be seen, two further base modules 10 are provided, they arranged below the base module 10 visible in FIG. 2A. Arrow 102 denotes the vertical direction (i.e. the direction from the sea bottom to the sea surface, i.e. the direction perpendicular to the earth surface). All three base modules are mounted to the subsea enclosure 42 of transformer module 40. Each base module 10 is provided for an output phase of the power output 102. Accordingly, the converter units 30 which are connected in series and/or in parallel for providing a single phase of the AC power output 102 are located within the same horizontal plane.

FIG. 2B shows that in each converter module 20, three converter units 30 are provided. In the exemplary embodiment of FIG. 2, 6×3=18 converter units 30 are thus provided for each output phase of power output 102.

FIG. 2C is a perspective view of the modular subsea converter 100 of FIGS. 2A and 2B. As can be seen, all three base modules 10 are mounted to a wall of subsea enclosure 42 of transformer module 40 (only a section of the subsea enclosure 42 is shown). For illustrating the arrangement of the converter units 30, the subsea enclosures 21 of the converter modules 20 are shown transparent.

In the example of FIG. 2, each base module 10 has a subsea enclosure 11 with six converter module mounting portions 18. In other configurations, base modules may for example have only two converter mounting portions 18, and plural of such base modules may be mounted together for increasing the number of available mounting portions 18. Accordingly, the base module 10 illustrated in FIG. 2A may in other embodiments be composed of three individual base modules mounted together. Similarly, the converter modules 20 may either be scaled by increasing the longitudinal dimension of the respective converter module 20, or by mounting converter modules 20 towards each other. For this purpose, converter modules 20 having subsea enclosures with mounting flanges at both ends thereof can be provided. Accordingly, the subsea converter 100 is highly modular and can be configured easily for a wide range of applications.

FIG. 3A shows a converter unit 30 in form of a power cell, it is an enlargement of the area marked with 'B' in FIG. 2B. Converter unit 30 has its own enclosure and is mounted via a heat conducting element to the subsea enclosure 21 of the converter module 20. The three-phase power input connection 31 of the converter unit 30 is shown. Furthermore, the single phase output connection 32 of the converter unit 30 is illustrated. By providing the converter modules 20 with a tubular subsea enclosure 21, which is surrounded by ambient seawater when installed subsea, an efficient cooling of the converter units 30 can be achieved. This is further improved by the thermal coupling of the converter unit 30 to the wall of subsea enclosure 21.

FIG. 3B shows an exemplary configuration of a converter unit 30, which can be used in embodiments of the invention. The three-phase power input connection 31 is connected to a diode rectifier stage, which generates an intermediate DC voltage. A DC link capacitor is furthermore provided. A power supply, driver and control circuitry 35 may be coupled to the DC link. Control connections which can in particular be optical fibres and/or electrical connections, are connected to the control circuitry 35, thus allowing control and monitoring of the converter unit 30. For generating an AC output power at variable AC frequency, controllable switches 33 are provided which are controlled by the control circuitry 35. These may for example be insulated gate bipolar transistors (IGBTs). These generate the single phase AC power output 32. Each converter unit 30 may effectively comprise an H-bridge converter.

FIG. 4 illustrates different configurations of the modular subsea converter 100. In FIG. 4A, three base modules 10, each having only two mounting portions 18, are provided. To each base module 10 two converter modules 20 are mounted, each comprising a single converter unit 30. Regarding the electrical configuration of the converter, this may accordingly be similar to the one illustrated in FIG. 1, where for each output phase of the power output 102, two converter units 30 are provided. In FIG. 4A, each of the base modules 10 may provide a single output phase of power output 102. As mentioned above, power output 102 may be provided by electrical penetrators, connectors, cable terminations or mounting flanges to which a cable termination or connector may be mounted, and may be provided in one or more of the base modules 10, in the transformer enclosure 42 of the transformer module 40, or in some embodiments, even on one or more of the converter modules 20.

Figure 4A:
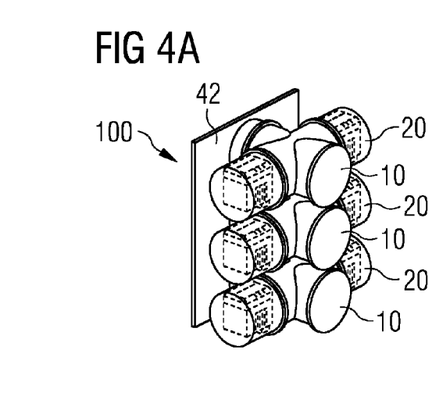
FIGS. 4A to 4F are schematic drawings showing perspective views of a modular subsea converter in different configurations according to an embodiment of the invention.
Figure 4B:
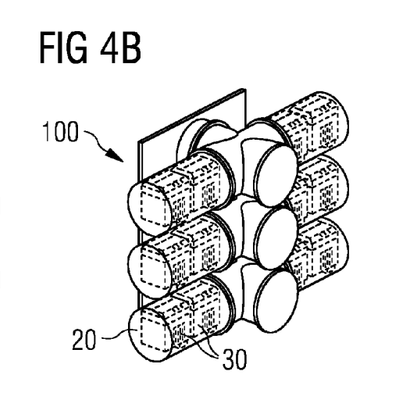
Figure 4C:
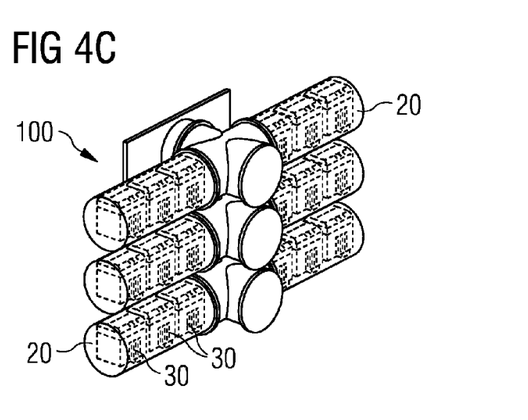

In FIG. 4B, the longitudinal dimension of the subsea enclosure 21 of each converter module 20 is increased in order to accommodate two converter units 30 in each converter module 20. The number of converter units 30 connected in series for each output phase of power output 102 may thus be increased efficiently. In FIG. 4C, the longitudinal extension of subsea enclosure 21 is increased even further, so that each converter module 20 now accommodates three converter units 30. With such configuration, six converter units 30 are available for each output phase of power output 102. Since each converter unit 30 receives three-phase AC electric power with a different phase shift, a total of 3×6=18 different AC phases may be received, so that a 36 pulse rectification is possible. For many applications, this is the preferred solution.

Figure 4D:
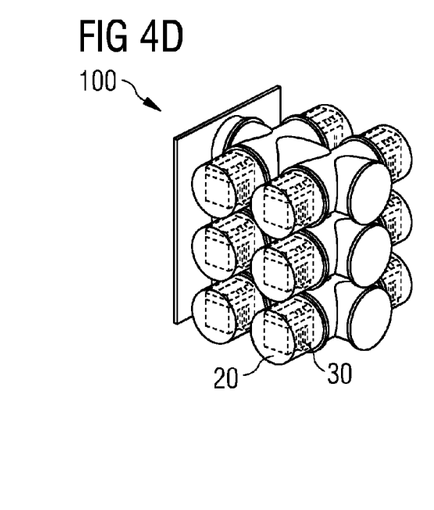

In FIG. 4D, the base module 10 comprises two further mounting portions 18 compared to the configuration of FIG. 4A. Again this may be achieved by increasing the size of each base module 10, or by mounting an additional base module 10 to the base module 10 of FIG. 4A. Twelve converter units 30 can thus be provided in the modular subsea converter 100, while the converter modules 20 themselves can be kept small.

Figure 4E:
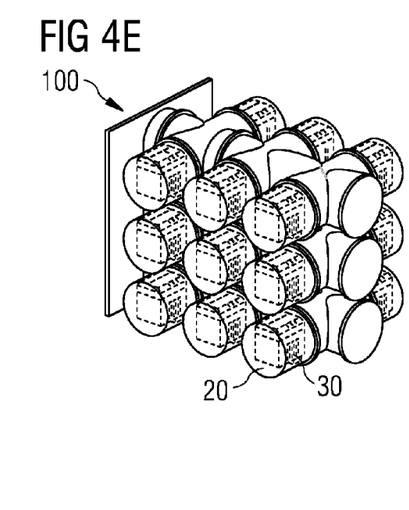

In FIG. 4E, each base module 10 comprises even six mounting portions 18. For each output phase of the power outputs 102, six converter units are thus provided. Accordingly, the electrical configuration can be similar to the one of FIG. 4C, yet the physical arrangement of converter modules and converter units is different. Accordingly, the modular subsea converter 100 can be adapted for different space requirements.

Figure 4F:
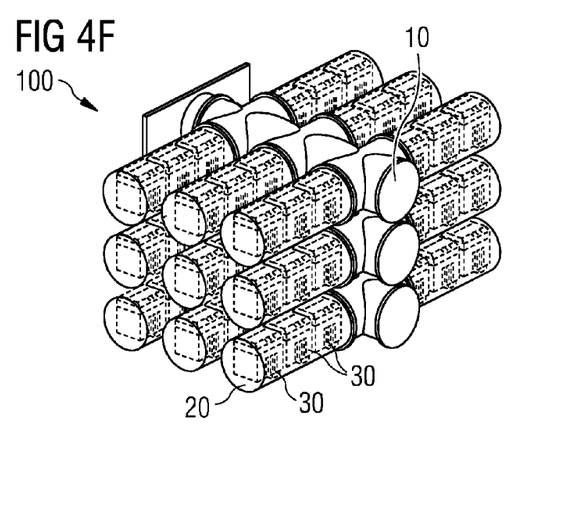

In FIG. 4F, a configuration of subsea converter 100 is illustrated in which each converter module comprises two further converter units compared to the configuration of FIG. 4E. The configuration of FIG. 4F thus corresponds to the configuration illustrated in FIG. 2.

It should be clear that features of the above outlined embodiments can be combined with each other. As an example, the modular subsea converter 100 may not comprise a transformer module 40, rather, the input transformer 41 may be arranged within one of the base modules 10, or within a single base module 10. Furthermore, a single base module 10 may only be provided and may comprise the electrical connections for all three phases of the power output 102. An example configuration may only comprise the uppermost base module 10 of the configuration of FIG. 4F, and may thus comprise 18 converter units, six for each output phase. The input transformer may be comprised within such base module 10, or, in other embodiments, no input transformer may be provided.

While specific embodiments are disclosed herein, various changes and modifications can be made without departing from the scope of the invention. The present embodiments are to be considered in all respects as illustrative and non-restrictive, and all changes coming within the meaning and equivalency range of the appended claims are intended to be embraced therein.

The invention claimed is:

1. A modular subsea converter for achieving a characteristic of output power, comprising:
at least one base module including a subsea enclosure and electrical connections disposed within the subsea enclosure; and
at least one converter module including
a converter unit, the at least one converter module being coupled to the at least one base module, and
a subsea enclosure in which the converter unit is disposed,
wherein the electrical connections of the at least one base module are coupled to the converter unit of the at least one converter module, and wherein the subsea enclosure of the at least one converter module is mounted to the subsea enclosure of the at least one base module, and
wherein the modular subsea converter is configured such that at least one of at least one additional converter modules and at least one additional base module is mounteable to the modular subsea converter for achieving a characteristic of the output power to be produced by the modular subsea converter.

2. The modular subsea converter of claim 1, wherein the modular subsea converter is at least a three phase converter for converting at least three phase AC electric power, wherein the at least one base module comprises electrical connections for the at least three phases, and wherein the modular subsea converter comprises at least one converter module for each of the at least three phases.

3. The modular subsea converter of claim 1, wherein the electrical connections of the at least one base module comprise, for each at least one converter module, at least a three phase power input connection and a single phase power output connection.

4. The modular subsea of claim 1, wherein the at least one converter module is a scalable converter module comprising a selectable number of converter units.

5. The modular subsea converter of claim 1, wherein the subsea enclosure of the at least one converter module includes a tubular structure closed at one end and provided with a mounting flange at the other end to mount the subsea enclosure to the at least one base module, and wherein an extension of the tubular structure in longitudinal direction is determined by a number of converter units disposed in the at least one converter module.

6. The modular subsea converter of claim 2, further comprising:
at least one converter unit for each output phase of the converted AC electric power.

7. The modular subsea converter of claim 1, wherein the modular subsea converter is configured to use, for each phase of output AC electric power, at least two phase shifted AC electric power sources, and wherein the modular subsea converter comprises, for each phase shifted AC electric power source, at least one converter unit per output phase.

8. The modular subsea converter of claim 7, further comprising at least one transformer providing the at least two, preferably at least three or at least six phase shifted AC electric power sources.

9. The modular subsea converter of claim 1, further comprises at least one transformer module including an AC transformer coupled to electrical connections of the at least one base module, or at least one transformer included in the at least one base module.

10. The modular subsea converter of claim 1, wherein the subsea enclosure of the at least one base module includes at least two converter module mounting portions, and wherein to each of the at least two converter module mounting portions, a converter module or a cover is mounted.

11. The modular subsea converter of claim 1, wherein the at least one base module includes at least one base mounting portions, configured to mount at least a further base module or a transformer module thereto.

12. The modular subsea converter of claim 1, wherein the at least one base module comprises a base module having a cylindrically shaped subsea enclosure with base mounting portions at opposing ends thereof, the base mounting portions being configured to mount at least a further base module or a transformer module thereto, the cylindrically shaped subsea enclosure further including at least two converter mounting portions configured to mount at least two converter modules thereto.

13. The modular subsea converter of claim 1, wherein the converter unit is a power cell.

14. The modular subsea converter of claim 1, wherein the converter unit includes at least two converter units for providing conversion of AC electric power, and wherein the at least one converter module includes at least two converter modules, each including at least one of the at least two converter units, each of the at least two converter modules being coupled to the at least one base module and including a subsea enclosure in which the respective at least one converter unit is disposed.

15. The modular subsea converter of claim 1,
wherein the modular subsea converter comprises at least two output phases, wherein the modular subsea converter is configured to use at least two phase shifted AC electric power sources,
wherein the modular subsea converter comprises for each phase shifted AC electric power source at least one converter unit per output phase, and
wherein the converter units are distributed between at least two different converter modules coupled to the at least one base module.

16. The modular subsea converter of claim 1, wherein the converter unit is a power electronic converter unit, and wherein the subsea enclosure of the at least one converter module is a pressure compensated enclosure that is pressure compensated against an ambient pressure.

17. A method of manufacturing the modular subsea converter of claim 1, the method comprising:
determining a characteristic of the output power to be produced by the modular subsea converter;
adjusting a configuration of the modular subsea converter by at least one of
adding or removing converter units to or from the converter module,
adding or removing converter modules, and
adding or removing base modules such that the characteristic of the output power is achieved.

18. The modular subsea converter of claim 1, wherein the characteristic is power rating or power quality of the output power to be produced by the modular subsea converter.

19. The modular subsea converter of claim 2, wherein the electrical connections of the at least one base module comprise, for each at least one converter module, at least a three phase power input connection and a single phase power output connection.

20. The modular subsea converter of claim 6, wherein the at least one converter unit, for each output phase of the converted AC electric power, includes at least two converter units for each output phase.

21. The modular subsea converter of claim 6, wherein the at least one converter unit, for each output phase of the converted AC electric power, includes at least three converter units for each output phase.

22. The modular subsea converter of claim 7, wherein the modular subsea converter is configured to use, for each phase of output AC electric power, at least three phase shifted AC electric power sources, and wherein the modular subsea converter comprises, for each phase shifted AC electric power source, at least one converter unit per output phase.

23. The modular subsea converter of claim 7, wherein the modular subsea converter is configured to use, for each phase of output AC electric power, at least six phase shifted AC electric power sources, and wherein the modular subsea converter comprises, for each phase shifted AC electric power source, at least one converter unit per output phase.

24. The modular subsea converter of claim 22, further comprising at least one transformer providing the at least three phase shifted AC electric power sources.

25. The modular subsea converter of claim 23, further comprising at least one transformer providing the at least six phase shifted AC electric power sources.

26. The modular subsea converter of claim 10, wherein the at least two converter module mounting portions are flanges.

27. The modular subsea converter of claim 11, wherein the at least one base module includes at least two base mounting portions, configured to mount at least a further base module or a transformer module thereto.

28. The modular subsea converter of claim 11, wherein the at least one base module includes at least one flange.

29. The modular subsea converter of claim 1, wherein the converter unit is an H-bridge converter.

30. The method of claim 17, wherein the characteristic is power rating or power quality.

31. A method of manufacturing the modular subsea converter of claim 2, the method comprising:
determining a characteristic of the output power to be produced by the modular subsea converter;
adjusting a configuration of the modular subsea converter by at least one of
adding or removing converter units to or from the converter module,
adding or removing converter modules, and
adding or removing base modules such that the characteristic of the output power is achieved.

32. The method of claim 31, wherein the characteristic is power rating or power quality.

* * * * *